United States Patent
Jeong et al.

(10) Patent No.: US 7,440,308 B2
(45) Date of Patent: Oct. 21, 2008

(54) PHASE-CHANGE RANDOM ACCESS MEMORY DEVICE AND METHOD OF OPERATING THE SAME

(75) Inventors: Chang Wook Jeong, Seoul (KR); Su-Youn Lee, Yongin-si (KR); Won-Cheol Jeong, Seoul (KR); Jae-Hyun Park, Yongin-si (KR); Su-Jin Ahn, Seoul (KR); Fai Yeung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 79 days.

(21) Appl. No.: 11/515,422

(22) Filed: Sep. 5, 2006

(65) Prior Publication Data
US 2007/0133270 A1    Jun. 14, 2007

(30) Foreign Application Priority Data
Sep. 5, 2005    (KR) ............... 10-2005-0082358

(51) Int. Cl.
*G11C 11/00* (2006.01)

(52) U.S. Cl. .................................. 365/148; 365/163
(58) Field of Classification Search ............. 365/148, 365/163
See application file for complete search history.

(56) References Cited

U.S. PATENT DOCUMENTS

| 6,838,692 | B1 | 1/2005 | Lung |
| 7,170,777 | B2 * | 1/2007 | Choi et al. ............ 365/163 |
| 2004/0178404 | A1 | 9/2004 | Ovshinsky |
| 2005/0112896 | A1 | 5/2005 | Hamann et al. |
| 2006/0091374 | A1 * | 5/2006 | Yoon et al. ............ 257/2 |
| 2006/0163553 | A1 * | 7/2006 | Liang .................... 257/3 |

* cited by examiner

*Primary Examiner*—Huan Hoang
(74) *Attorney, Agent, or Firm*—Lee & Morse, P.C.

(57) ABSTRACT

A phase-change random access memory device may include a phase-change pattern, a first electrode structure connected to the phase-change pattern, and a second electrode structure spaced apart from the first electrode structure and connected to the phase-change pattern, wherein at least one of the first electrode structure and the second electrode structure includes a plurality of resistor patterns connected to the phase-change pattern in parallel.

19 Claims, 11 Drawing Sheets

PHASE-CHANGE RANDOM ACCESS MEMORY DEVICE AND METHOD OF OPERATING THE SAME

BACKGROUND OF THE INVENTION

1. Field of the Invention

The invention relates to a semiconductor device and a method of operating a phase-change random access memory device. More particularly, the invention relates to a phase-change random access memory device and a method of operating a phase-change random access memory device.

2. Description of the Related Art

Memory semiconductor devices may be classified into volatile memory devices and non-volatile memory devices based on whether or not a supply of power is necessary to maintain data stored in the memory. Volatile memory devices, e.g., a dynamic random access memory (DRAM) and a static random access memory (SRAM), may have relatively fast operating speeds, but generally require a supply of power to maintain data. In general, non-volatile memory devices, e.g., a flash memory, generally do not require a supply of power, but generally have a relatively slow writing speed. Table 1 below lists some advantages and disadvantages of conventional memory devices. New memory devices that overcome one or more disadvantages of the conventional memory device are desired.

TABLE 1

| | Volatile memory device | | Non-volatile memory device | | | |
|---|---|---|---|---|---|---|
| Type | SRAM | DRAM | FLASH | FeRAM | MRAM | PRAM |
| READ speed | High | Medium | High | Medium | Medium/high | Medium/high |
| WRITE speed | High | Medium | Low | Medium | Medium/high | Medium |
| Non-volatility | No | No | Yes | Medium | Yes | Yes |
| Refresh | Unnecessary | Necessary | Unnecessary | Unnecessary | Unnecessary | Unnecessary |
| Size of Unit Cell | Large | Small | Small | Medium | Medium | Small |

In view of current trends of miniaturization and portability in electronic products, and the dependence of semiconductor device price on the density of integration, new memory devices that satisfy a plurality of technical requirements, e.g., non-volatility, low-power consumption, fast operating speeds and high integration, are desired. Attempts to satisfy such technical requirements have introduced phase-change random access memory (PRAM) devices, magnetic random access memory (MRAM) devices, and ferroelectric random access memory (FeRAM) devices as next-generation memory devices.

Relative to the MRAM and FeRAM devices, PRAM devices may have low manufacturing costs because a phase-change material layer may be easily formed without technical problems. Moreover, data stored in the PRAM devices can be dependably maintained for more than $10^{13}$ iterations, and PRAM devices can operate at high speeds, e.g., about 30 ns.

Figure 1:
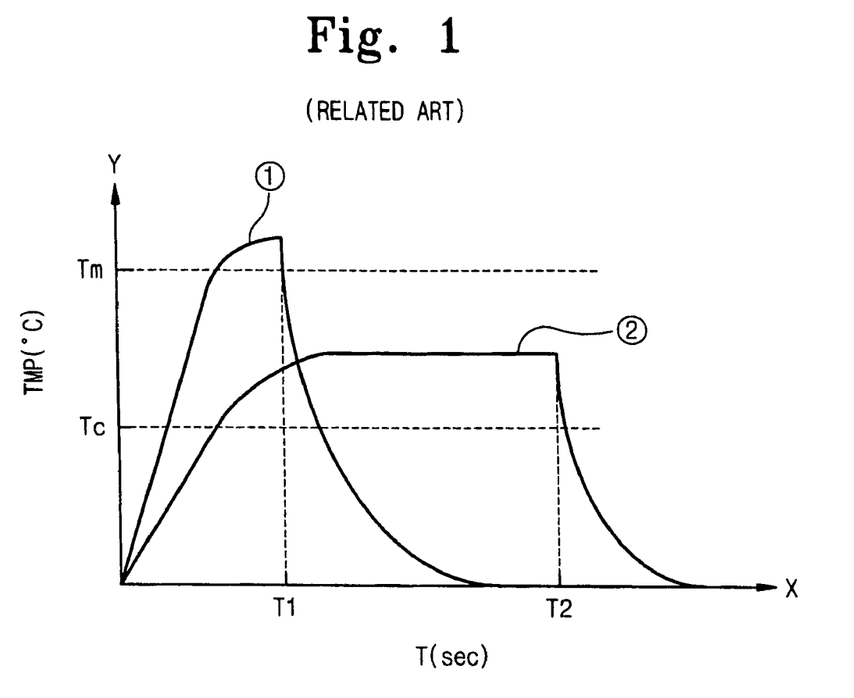
FIG. 1 illustrates a graph of characteristics of a phase-change material layer according to temperature and time.

FIG. 1 illustrates a graph of a crystalline state of a phase-change material layer according to temperature and time. In FIG. 1, an x-axis and a y-axis denote time T and temperature TMP, respectively.

Referring to FIG. 1, if the phase-change material layer is heated to a temperature above a melting temperature Tm for a first duration T1, and then cooled, the phase-change material layer may transition to an amorphous state (1). If the phase-change material layer is heated to a temperature between the melting temperature Tm and the crystallization temperature Tc for a second duration T2, which is longer than the first duration T1, and then cooled, the phase-change material layer may transition to a crystalline state (2). Resistance of the phase-change material layer in a crystalline state may be different, e.g., lower, than a resistance of the phase-change material layer in an amorphous state. This property of the phase-change material layer, i.e., resistance that depends on the crystalline state of the phase-change material layer, may be used for a reading operation of a phase-change memory cell. For example, data stored in the phase-change memory cell may be determined by sensing a current flowing through the phase-change material layer.

Because data of a PRAM device may be distinguished based on a crystalline state of the phase-change material layer, unlike a conventional memory device, one phase-change memory cell may have several data states. In particular, if a crystalline region, i.e., a region having a crystalline state, which may be formed on the phase-change material layer, is changed in volume, an electrical resistance of the phase-change material layer may be changed. Thus, because data stored on the phase-change material layer may be dependent on an electrical resistance thereof, an adjustment in volume of crystalline region may enable one cell to have several data states.

Figure 2:
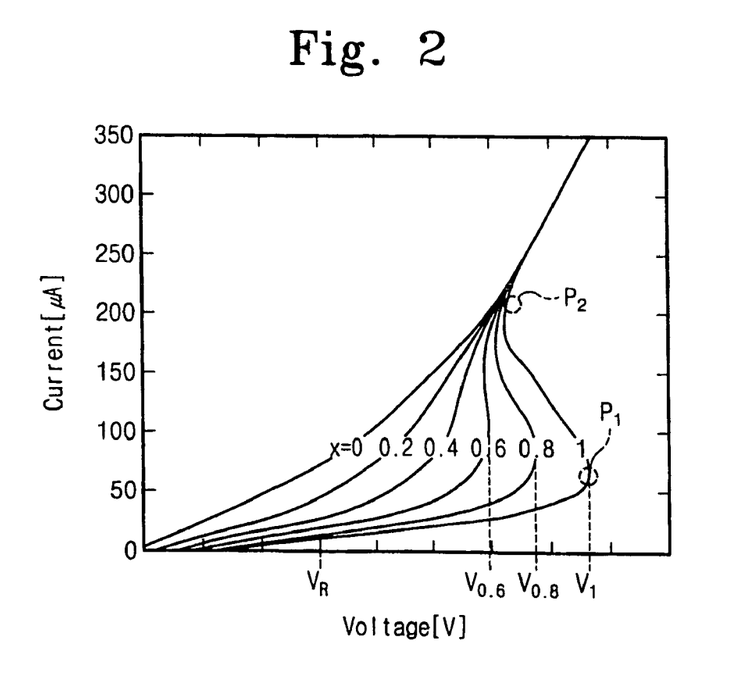
FIG. 2 illustrates a current-voltage graph of a known multi-bit phase-change random access memory device.

FIG. 2 illustrates a relationship between current and voltage based on a change in volume of a crystalline region. In FIG. 2, an x-value may be a parameter for determining a resistance of the phase-change material layer. For example, x=1, may correspond to a current-voltage curve (I-V curve) for a case in which an entire programmable region of the phase-change material layer transitions to an amorphous state, and x=0 may correspond to an I-V curve for a case in which an entire programmable region transitions to a crystalline state. In general, a writing operation may not change a crystalline state of the entire phase-change material layer, but may change a crystalline state of a local region. A programmable region may correspond to a maximum size of a local region in which a crystalline state is changed during a writing operation. As illustrated in FIG. 2, for 0<x<1, the I-V curve may correspond to a case in which a portion of the programmable region has a crystalline state, and a change of an x-value represents a change in volume of the crystalline region.

Referring to FIG. 2, the I-V curve for x=1 may have a first inflection point $P_1$ and a second inflection point $P_2$, where the second inflection point $P_2$ may correspond to a smaller voltage coordinate than that of the first inflection point $P_1$, and a larger current coordinate than that of the first inflection point $P_1$. The respective I-V curve for other x-values may also have respective first and second inflection points. For each I-V curve, a voltage coordinate, e.g., $V_1$, $V_{0.8}$, and $V_{0.6}$, of the first inflection point $P_1$, may denote a minimum voltage, i.e., a threshold voltage $V_{th}$, which may be required to form crystalline regions, of a volume corresponding to the x-value, in the phase-change material layer in an amorphous state. If, e.g., a voltage of the $V_1$ or higher is applied to the phase-change memory cell, the entire programmable region may transition to a crystalline state. If, e.g., a voltage between $V_{0.6}$ and $V_{0.8}$ is applied to the phase-change memory cell, a crystalline region having a volume corresponding to an x-value between 0.6 and 0.8 may be formed in the programmable region. Accordingly, as illustrated in FIG. 2, the magnitude of a current measured at a predetermined reading voltage $V_R$ may be dependent on a volume of each crystalline region, i.e., an x-value. As discussed above, owing to the current characteristics depending on the x-value, one cell may be one of several data states.

Referring to FIG. 2, I-V curves for x=0, 0.2, and 0.4 may have inflection points, i.e., threshold voltages, whose position, i.e., coordinate values, may be unclear. Due to such uncertainty of the threshold voltage, a write voltage, which may be needed to change the phase-change memory cell into a required data state, may be difficult to determine. Thus, it may be difficult to determine a data state of the memory cell based on the applied write voltage. Owing to the uncertainty of the threshold voltage, the threshold voltages for x=0, 0.2, and 0.4 may not be obviously distinguished from a voltage applied for a writing operation. As a result, the data state of the phase-change memory cell may be changed by repetitive reading operations. Such change of data state may be detrimental and/or fatal to product quality of the memory device.

With regard to I-V curves for x=0, 0.4, and 0.6, the respective currents at the reading voltage $V_R$ may be too similar to be distinguished. Such similarity in the current coordinates may make it difficult to perform a reading operation, because recorded data may be determined based on the relation between a data state and a corresponding current.

SUMMARY OF THE INVENTION

The invention is therefore directed to phase-change random access memory devices, which substantially overcome one or more of the problems due to the limitations and disadvantages of the related art.

It is therefore a feature of embodiments of the invention to provide a phase-change random access memory device with discrete threshold voltages.

It is therefore a separate feature of embodiments of the invention to provide a phase-change random access memory device capable of minimizing a disturbance of data that may result from a reading operation.

It is therefore a separate feature of embodiments of the invention to provide methods of operating a phase-change random access memory device with discrete threshold voltages.

It is therefore a separate feature of embodiments of the invention to provide methods of operating a phase-change random access memory device capable of minimizing a disturbance of data that may result from a reading operation.

At least one of the above and other features and advantages of the invention may be realized by providing a phase-change random access memory device, including a phase-change pattern, a first electrode structure connected to the phase-change pattern, and a second electrode structure spaced apart from the first electrode structure and connected to the phase-change pattern, wherein at least one of the first electrode structure and the second electrode structure may include a plurality of resistor patterns connected to the phase-change pattern in parallel.

At least one of the resistor patterns may have an electrical resistance different from another of the plurality of resistor patterns. At least one of the resistor patterns may have a resistivity different from another of the plurality of resistor patterns. The resistor patterns may include at least one of a titanium nitride, titanium aluminum nitride, polysilicon, a tantalum nitride, and tungsten. Each of the plurality of resistor patterns may be associated with a different portion of the phase-change pattern and each resistor pattern-phase-change pattern portion corresponds to a memory element, threshold voltages of the memory elements may be different from each other. The phase-change random access memory device may include a transistor connected to the first electrode structure, and a bit line connected to the second electrode structure.

The first electrode structure may include a plurality of resistor patterns connecting the transistor with the phase-change pattern in parallel, the second electrode structure may connect the bit line with the phase-change pattern in series, and memory elements including the resistor patterns and the phase-change pattern may have respectively different threshold voltages. The first electrode structure may connect the transistor with the phase-change pattern in series, the second electrode structure may include the plurality of resistor patterns connecting the bit line with the phase-change pattern in parallel, and memory elements including the resistor patterns and the phase-change pattern may have respectively different threshold voltages.

The first electrode structure may include a plurality of bottom resistor patterns connecting the transistor with the phase-change pattern in parallel, the second electrode structure may include a plurality of top resistor patterns connecting the bit line with the phase-change pattern in parallel, top memory elements including the top resistor patterns and the phase-change pattern may have respectively different threshold voltages, and bottom memory elements including the bottom resistor patterns and the phase-change pattern may have respectively different threshold voltages. The plurality of resistor patterns includes may include an axis electrode connected to one side of the phase-change pattern, and at least one ring electrode surrounding the axis electrode and connected to one side of the phase-change pattern.

The phase-change random access memory device may include insulation patterns interposed between the axis electrode and the ring electrons to electrically insulate them. Each of the resistor patterns may have a different size and/or may be formed of a different material relative to the others of the plurality of resistor patterns. Each of the plurality of resistor patterns may be associated with a different portion of the phase change-pattern.

At least one of the above and other features and advantages of the present invention may be realized by providing a method of operating a phase-change memory cell including a plurality of memory elements including respectively different threshold voltages and connected in parallel, the method may include a write operation including selectively changing resistances of the memory elements by using a difference between the threshold voltages to allow the phase-change memory cell to have several data states, and a read operation including determining the data state of the phase-change memory cell by sensing a difference in current relative to a difference in resistance between the memory elements.

The writing operation may include resetting all the memory elements into off-states, and selectively setting at least one of the memory elements into an on-state, wherein the setting of the memory elements may include selectively heating a part of the memory elements by using the difference between the threshold voltages. The resetting of the memory elements may include applying a voltage higher than the highest voltage among the threshold voltages, and the setting of the memory elements may include applying a voltage between the threshold voltages to selectively set the memory elements having a threshold voltage lower than the applied voltage into on-states.

The setting of the memory elements may include a first step of setting selectively an N number of the memory elements into an on-state, N may be less than M, and a second step of setting selectively an N+1 number of the memory elements into an on-state, N+1 may be less than or equal to M, wherein M denotes a total number of the memory elements, and N may be an integer where $1 \leq N<M$, and the resetting of the memory elements may be performed between the first step of setting and the second step of setting.

Each of the memory elements may include a phase-change material and conductive heating units connected to one side of the phase-change material, the phase-change material of the memory elements may correspond to a phase-change pattern for the phase-change memory cell, the conductive heating units of the memory elements may have respectively different resistances, wherein the resetting of the memory elements may include changing a phase-change material of all the memory elements into an amorphous state, and the setting of the memory elements may include selectively changing a phase-change material of a predetermined memory element into a crystalline state using a difference of resistances of the conductive heating units.

The write operation may be performed by using one of a voltage forcing method and a current forcing method, the voltage forcing method may include applying a voltage of a predetermined magnitude to both ends of the memory elements, the current forcing method may include applying a current of a predetermined magnitude to both ends of the memory elements.

Each of the memory elements may correspond to a portion of a phase-change pattern, and the write operation may include selectively changing resistances of the memory elements by changing a state of the corresponding portion of the phase-change pattern to one of an amorphous state and a crystalline state.

BRIEF DESCRIPTION OF THE DRAWINGS

The above and other features and advantages of the invention will become more apparent to those of ordinary skill in the art by describing in detail exemplary embodiments thereof with reference to the attached drawings in which.

DETAILED DESCRIPTION OF THE INVENTION

Korean Patent Application No. 2005-82358, filed on Sep. 5, 2005, in the Korean Intellectual Property Office, and entitled: "Phase Change Random Access Memory Device and Method of Operating the Same," is incorporated by reference herein in its entirety.

The invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Like reference numerals in the drawings denote like elements, and thus their detailed description will be omitted for conciseness. In the drawings, the thickness of layers and regions may be exaggerated for clarity. Moreover, terms such as first, second and third are used to describe various regions and layers in various embodiments of the invention, but the regions and layers are not limited to the terms. The terms are used to distinguish a predetermined region or layer from another region or layer. Accordingly, a first layer referred in one embodiment may be referred to as a second layer in another embodiment. Each exemplary embodiment explained and illustrated herein includes its complementary embodiment.

Figure 3:
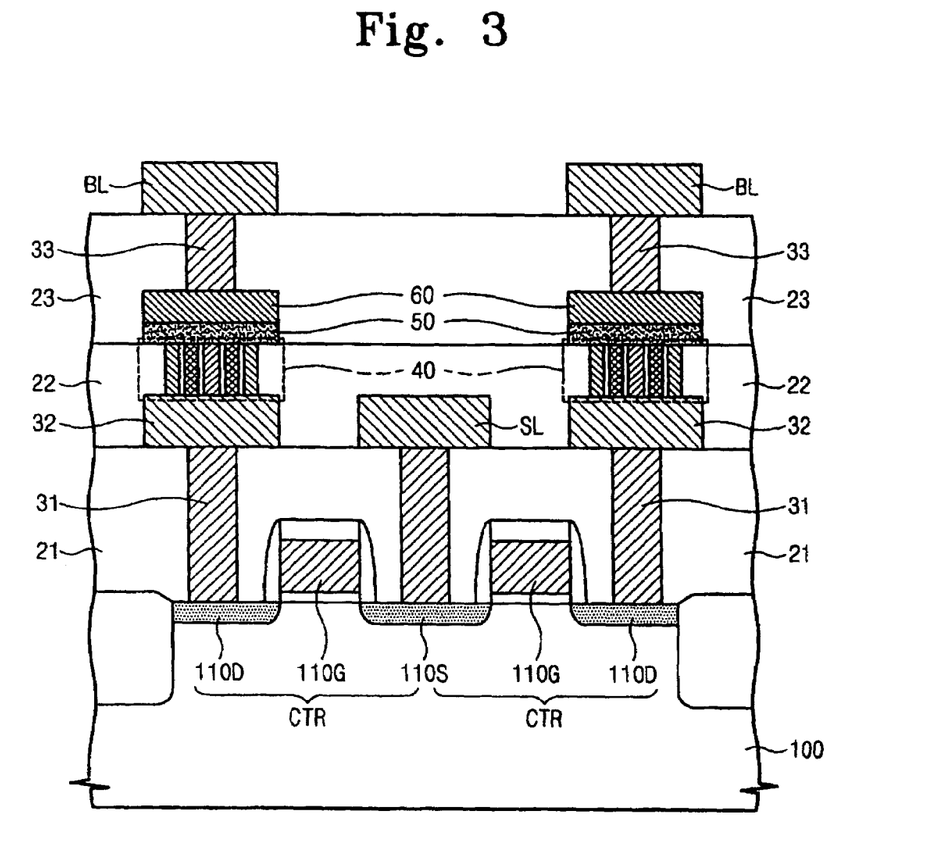
FIG. 3 illustrates a cross-sectional view of a phase-change random access memory device according to a first exemplary embodiment of the invention.
Figure 4:
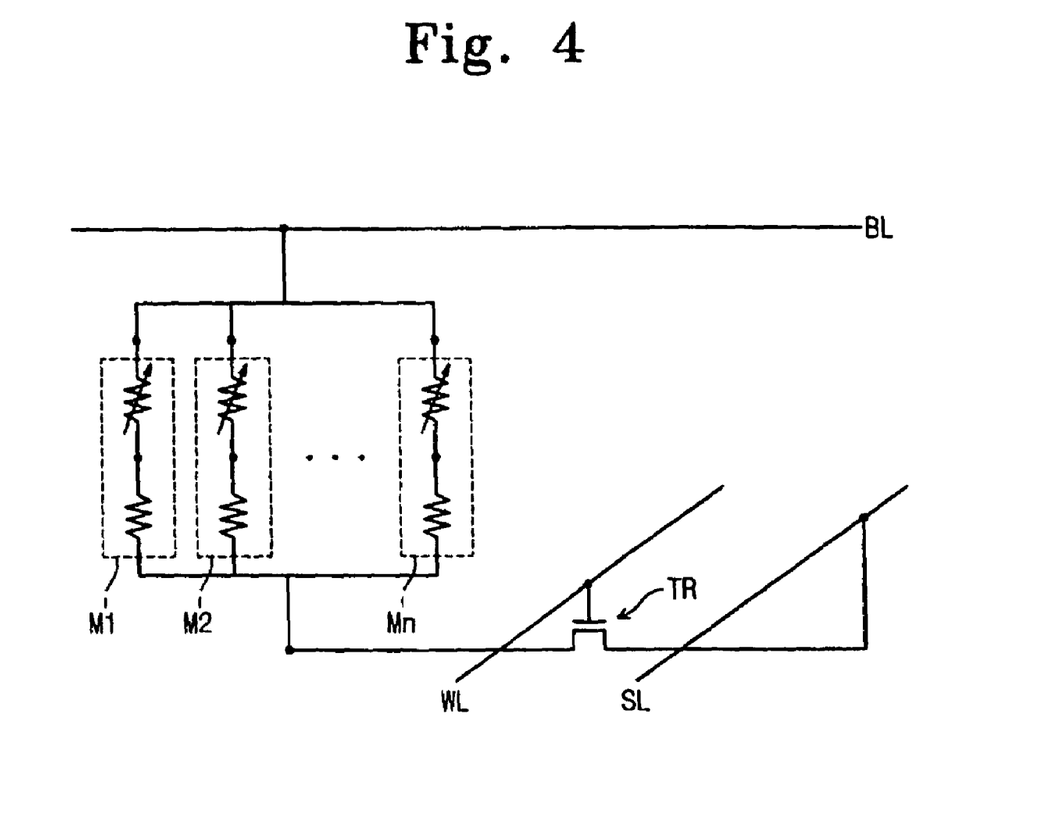
FIG. 4 illustrates an exemplary circuit diagram of the phase-change random access memory device according to the first exemplary embodiment of the invention.

FIGS. 3 and 4 respectively illustrate a cross-sectional view and a circuit diagram of a phase-change random access memory device according to a first exemplary embodiment of the invention.

Referring to FIGS. 3 and 4, a phase-change random access memory device according to one or more aspects of the invention may include a phase-change pattern 50. The phase-change pattern 50 may be formed of, e.g., alloy materials. In embodiments of the invention, the phase-change pattern 50 may include antimony (Sb) and may be formed, e.g., $Ge_2Sb_2Te_5$. A bottom electrode 40 and a top electrode 60, which may be spaced apart from each other, may be electrically connected to the phase-change pattern 50. In such embodiments, e.g., the bottom electrode 40 may include a plurality of bottom resistor patterns connected to the phase-change pattern 50 in parallel. The resistor patterns may include at least one of a titanium nitride, titanium aluminum nitride, polysilicon, a tantalum nitride, and tungsten.

Figure 5A:
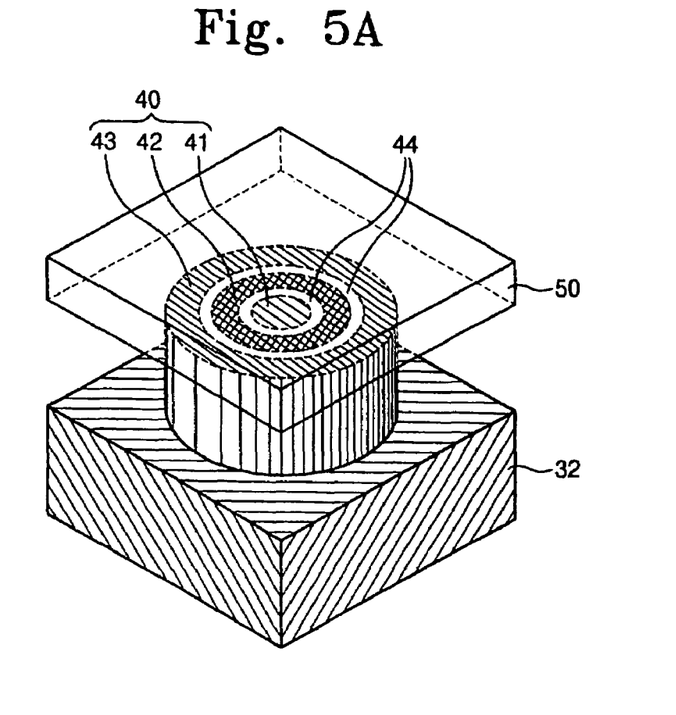
FIGS. 5A, 5B and 5C illustrate top-side perspective views of a portion of a phase-change random access memory device according to one or more aspects of the invention.
Figure 5B:
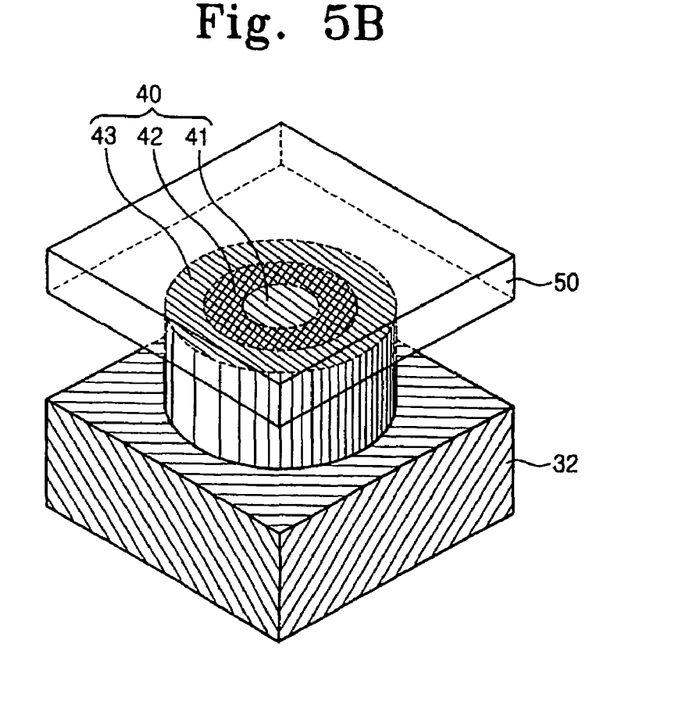

In embodiments of the invention, the bottom resistor patterns of the bottom electrode 40 may be provided in various shapes, sizes and/or quantities, which may be connected in parallel to the phase-change layer 50. As illustrated in FIGS. 5A and 5B, the bottom electrode 40 may include bottom resistor patterns having ring-like shapes. For example, the bottom resistor patterns may include an axis electrode 41 and a plurality of ring electrodes 42 and 43 surrounding the axis electrode 41. Although only two ring electrodes 42 and 43 are illustrated in FIG. 5A, embodiments of the invention are not limited to two ring electrodes and may include less than or more than two ring electrodes. As illustrated in FIG. 5A, insulation patterns 44 may be interposed between the axis electrode 41 and the ring electrode 42, and between the ring electrodes 42 and 43 to electrically insulate the axis electrode 41 and the ring electrodes 42 and 43.

As illustrated in FIG. 5B, in embodiments of the invention, the insulation patterns 44 may not be used. In such embodiments, the axis electrode 41 may contact the ring electrode(s) 42, 43 and/or the ring electrode(s) 42, 43 may contact each other. In embodiments of the invention, each of the ring electrodes 42 and 43, i.e., the resistive patterns, may be formed of materials with respectively different resistances. In embodiments of the invention including, e.g., more than two ring electrodes, some or all of the ring electrodes may have different resistances relative to each other.

Figure 5C:
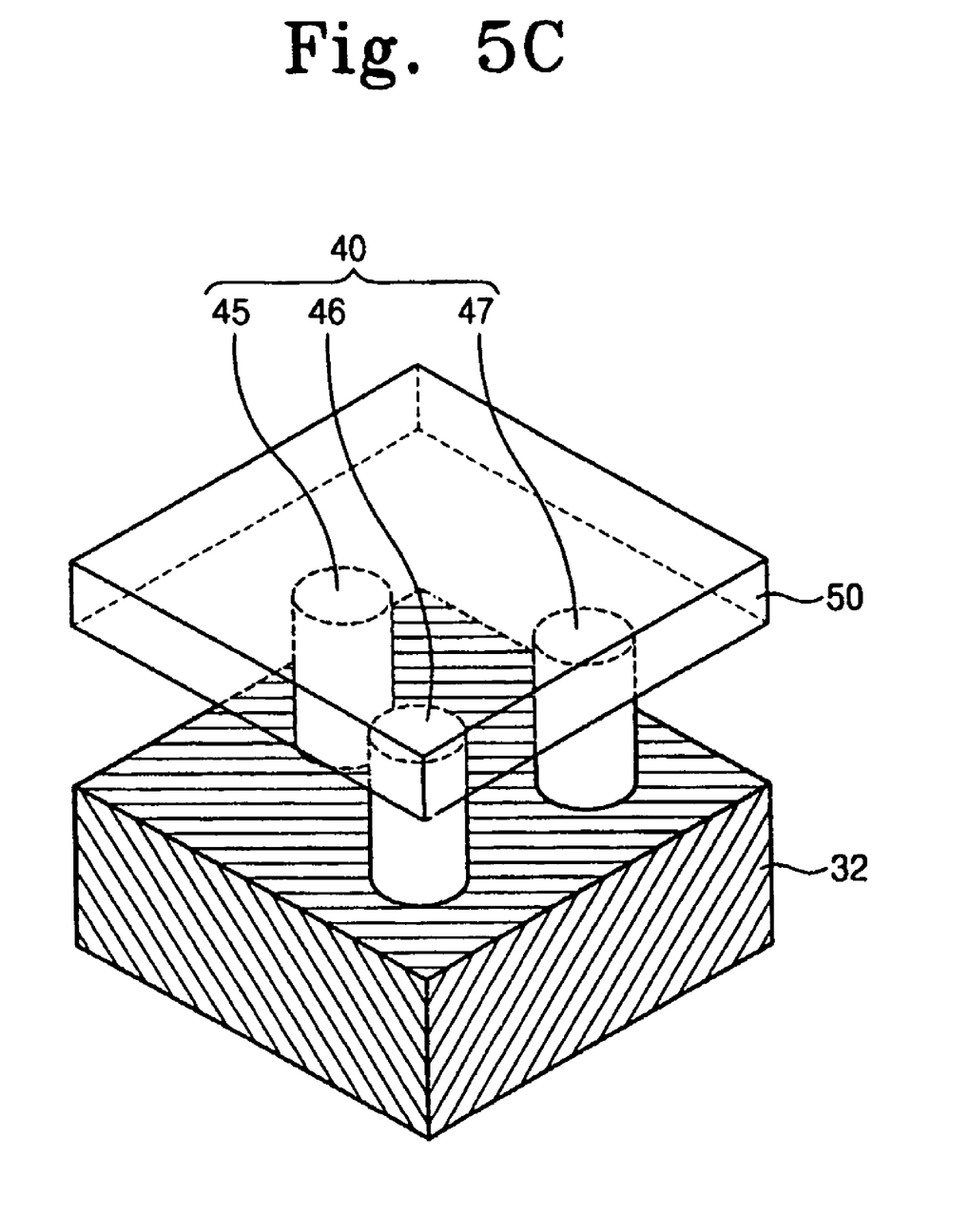

As described above, embodiments of the invention are not limited to ring-like structures for the bottom resistor patterns of the bottom electrode 40. In other embodiments of the invention including a parallel connection between the bottom resistor patterns of the bottom electrode 40 and the phase-change pattern 50, as illustrated in FIG. 5C, e.g., the bottom electrode 40 may include a plurality of bottom resistor patterns 45, 46 and 47, which may be independently oriented and/or spaced apart each other. In embodiments of the invention, the bottom resistor patterns 45, 46 and 47 may have different main axes relative to each other. Although three bottom resistor patterns 45, 46 and 47 are illustrated, embodiments of the invention are not limited to three bottom resistor patterns, and may include less than or more than three bottom resistor patterns.

Various methods may be employed to connect, in parallel, the bottom resistor patterns 45, 46 and 47 to the phase-change pattern 50. That is, various methods may be employed to connect, in parallel, the bottom electrode 40 and the phase-change pattern 50. For example, the bottom resistor patterns 45, 46 and 47, which may be spaced apart each other, may be connected to a sidewall(s) of the phase-change pattern 50.

Referring back to FIGS. 3 and 4, the bottom electrode 40 and the top electrode 60 may be electrically connected to a cell transistor CTR, and a bit line BL for selecting the phase-change pattern 50. For this connection, as illustrated in FIG. 3, plugs 31 and 33 and pads 32 may be used. In embodiments of the invention, the cell transistor CTR may be a metal oxide semiconductor (MOS) transistor having a gate electrode 110G connected to a word line WL, a source electrode 110S connected to a source line SL, and a drain electrode 110D connected to the bottom electrode 40. The word line WL may be disposed to be parallel to the source line SL, and may cross and/or overlap with the bit line BL. Interlayer insulation layers 21, 22 and 23 may be disposed between the cell transistor CTR and the bit line BL to structurally support the conductive patterns and electrically insulate the cell transistor CTR and the bit line BL from each other.

As discussed above, an electrical resistance of the phase-change pattern 50 may be dependent on a crystalline state of the phase-change pattern 50, and thus, a data storing mechanism of the phase-change random access memory device may be based on a change in electrical resistance thereof. Referring to FIG. 5C and FIGS. 7A-7D, the bottom resistor patterns 45, 46, 47 and a corresponding part of the phase-change pattern 50 contacting each of the bottom resistor patterns, may correspond to memory elements M1 to Mn, which may be used independently as a memory device. As described above, the bottom resistor patterns 45, 46, 47 may be connected to the phase-change pattern 50 in parallel. The resulting memory elements M1, M2 and/or M3 may correspond to one memory structure. That is, in embodiments of the invention, e.g., one cell may include one memory structure, which may include a plurality of memory elements, e.g., M1, M2, M3, connected in parallel.

According to one or more aspects of the invention, the memory elements M1, M2, M3 may be formed to have respectively different threshold voltages. In such embodiments, e.g., the bottom resistor patterns 45, 46, 47 may be formed to have respectively different resistances. As discussed above, a memory structure including memory elements M1, M2, M3 having different threshold voltage(s) may have a plurality of states of data, and thus, a number of data that may be stored in a unit cell of a memory device may be increased, according to one or more aspects of the invention.

In general, a resistance of a material is proportional to resistivity and a length of the material, and inversely proportional to a cross-section of the material. Thus, in embodiments of the invention, a resistance of the bottom resistor patterns 45, 46, 47 may be formed of, e.g., materials with a specific resistance or may be adjusted using a method of changing a cross-section of the bottom resistor patterns. According to one or more aspects of the invention, a titanium nitride layer, a titanium aluminum nitride layer, polycrystalline silicon, a tantalum nitride layer and/or tungsten may be used as the bottom resistor patterns 45, 46, 47.

Referring to FIGS. 5A and 5B, even though the axis electrode 41 and the ring electrodes 42 and 43 may be formed of an identical material, an electrical resistance of some or each of the axis electrode 41 and the ring electrodes 42, 43 may be different based, e.g., on sizes thereof. In other embodiments of the invention, at least one of the axis electrode 41 and the ring electrodes 42 and 43 may be formed of a material with a different resistivity. Thus, in embodiments of the invention, each of the axis electrode and the ring electrodes 42, 43 may be formed of a material with a different resistivity and/or may have different dimensions.

In embodiments of the invention, as illustrated in FIG. 5C, because each of the bottom resistor patterns 45, 46 and 47 may be independently formed, cross-sections of the bottom resistor patterns 45, 46 and 47 may be independently adjusted. Such independent adjustment of the cross-sections may allow resistances of the bottom resistor pattern 45, 46 and 47, and furthermore threshold voltages of the memory elements M1, M2, M3 to be changed, as necessary. In other embodiments of the invention, at least of one among the bottom resistor patterns 45, 46 and 47 may be formed of a material with a different resistivity.

Similar to the graph illustrated in FIG. 1, in embodiments of the invention, a crystalline state of the phase-change pattern 50 may be dependent on temperature and time. A temperature of the phase-change pattern 50 may be dependent on Joule heating that may be generated from the bottom electrode 40, which may be used as a heating unit. The Joule heating heat that may be generated by the bottom electrode 40 may satisfy the following relationship:

$$H=I^2Rt \quad \text{Equation 1}$$

The terms I, R and t in Equation 1 may represent a current flowing through the bottom electrode 40, a resistance of the bottom electrode 40, and a time of current flow, respectively. A temperature of the phase-change pattern 50 may be dependent on a resistance of the bottom electrode 40.

Because current and time are physical variables that may be externally controlled, a resistance R of the bottom electrode 40 may be an inherent physical parameter, which may determine a threshold heat of the phase-change pattern 50. A threshold heat may correspond to a minimum amount of heat that may be required to change a crystalline state of the phase-change pattern 50. According to the Ohm's law, a voltage is expressed by multiplying a current by a resistance (i.e., V=IR). Accordingly, a voltage applied to the bottom electrode 40 to generate the threshold heat may be determined by a resistance of the bottom electrode 40. That is, when a resistance of the bottom electrode 40 is changed, a threshold voltage of the memory element(s), e.g., M1, M2, M3, may change and/or may be different. A more detailed description of how a phase-change memory cell, including memory elements connected in parallel that may have respectively different threshold voltages, may have several data states is provided below.

Figure 6:
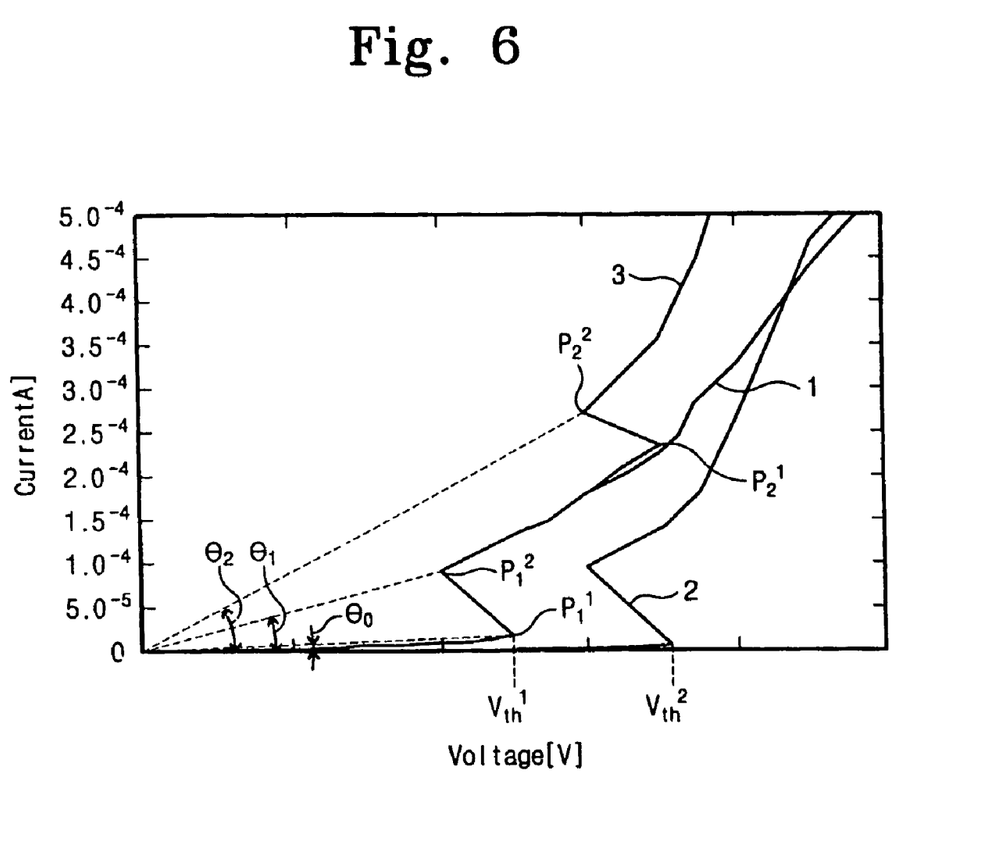
FIG. 6 illustrates a current-voltage graph of a phase-change random access memory device according to the first exemplary embodiment of the invention.

FIG. 6 illustrates an I-V graph of a phase-change random access memory device including first and second memory elements M1, M2, with respectively different threshold voltages, which are connected in parallel.

For convenience, I-V curves 1 and 2 of first and second memory elements and a superposition curve 3 of the I-V curves 1 and 2 are illustrated together. Although a phase-change memory cell having two memory elements will be described below, embodiments of the invention are not limited to having two memory elements. The description below may be extended to cases in which the phase-change memory cell may have more than two memory elements.

Referring to FIG. 6, because, e.g., a threshold voltage $V_{th}^1$ of a first memory element 1 is different from a threshold voltage $V_{th}^2$ of a second memory element 2, I-V curve 3 representing the parallel connection of first and second memory elements M1, M2 may have at least four meaningful inflection points. In the graph, two inflection points $P_1^1$ and $P_1^2$, with relatively small current coordinates, may correspond to first and second inflection points of the first memory element M1, and two inflection points $P_2^1$ and $P_2^2$, with relatively larger current coordinates, may correspond to first and second inflection points of the second memory element M2. Voltage coordinates $V_{th}^1$ and $V_{th}^2$ of the first inflection points $P_1^1$ and $P_2^1$ may denote the corresponding threshold voltages of the first and second memory elements M1, M2, respectively.

As described above, because each memory element may be independent, a threshold voltage of one of the memory elements M1, M2 may be determined by the structure and material of the bottom electrode 40, which constitutes the memory element, e.g., M1, M2. More particularly, the structure and material of the bottom electrode 40 may be process parameters that may depend on a manufacturing process of the memory element M1, M2, and may be independent of external electrical conditions. Accordingly, threshold voltages, e.g., $V_{th}^1$ and $V_{th}^2$, of the memory elements M1, M2 may be independently determined irrespective of external electrical conditions. As discussed above, according to the conventional art, a position of a threshold voltage for determining a state of stored data may be mainly dependent on external electrical conditions, such as current and time. Thus, as discussed above, in the conventional art, the threshold voltage may be uncertain.

Embodiments of the invention may be advantageous over the conventional art at least by providing a structure for a memory device including memory elements for which the threshold voltages thereof may be determined irrespective of external electrical conditions. Embodiments of the invention may enable the threshold voltage(s) of the memory elements, e.g., M1, M2, to be clearly differentiated from each other and easily controlled by changing the structure and/or the material of the bottom electrode 40. As a result, the crystalline states, i.e., data states, of the memory elements, e.g., M1, M2, may be changed selectively. A process, e.g., a writing process, for changing these data states will be described below.

FIGS. 7A to 7D illustrate schematic diagrams of a selective writing operation in memory elements M1, M2, M3, according to the exemplary embodiment of the memory device illustrated in FIG. 5C. As illustrated by the dashed lines in FIGS. 7A-7D, embodiments of the invention may include, e.g., an insulating layer around each of the bottom resistor patterns 45, 46, 47.

Data states and an on/off-state of each memory element M1, M2, M3, corresponding to FIGS. 7A to 7D may be shown in Table 2 below. For convenience, a memory cell will be described, in which first, second and third memory elements M1, M2 and M3 with respectively different threshold voltages are connected in parallel. The second threshold voltage $V_{th}^2$ of the second memory element M2 may be larger than the first threshold voltage $V_{th}^1$ of the first memory element M1, and the third threshold voltage $V_{th}^3$ of the third memory element M3 may be larger than the second threshold voltage $V_{th}^2$ of the second memory element M2. As described above, adjustment of a threshold voltage may be possible by changing a structure and/or a material of each of the bottom resistor patterns, e.g., 45, 46, 47.

TABLE 2

Figure 7A:
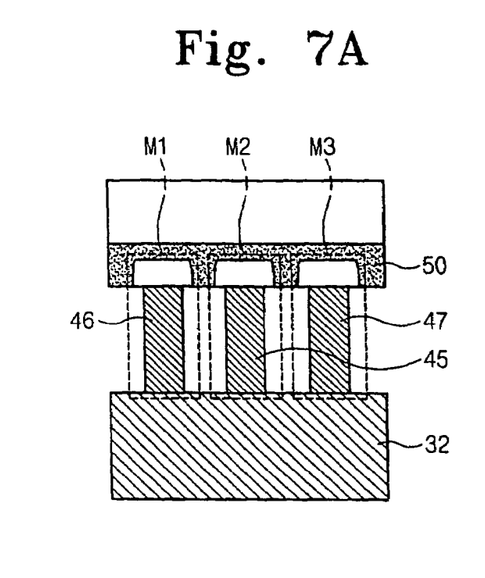
FIGS. 7A to 7D illustrate schematic diagrams of a selective writing operation in memory elements according to the exemplary embodiment of the invention illustrated in FIG. 5C.
Figure 7B:
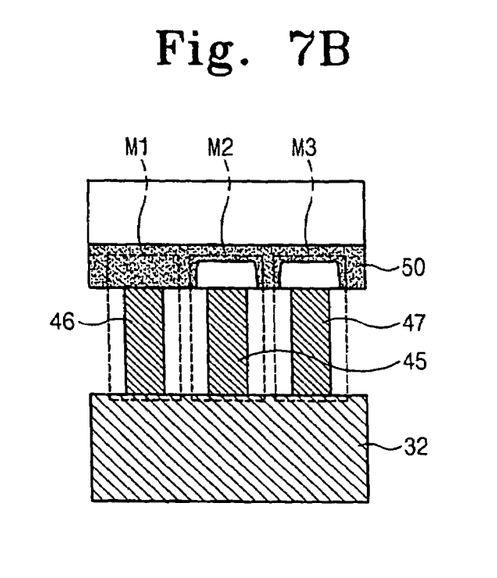
Figure 7C:
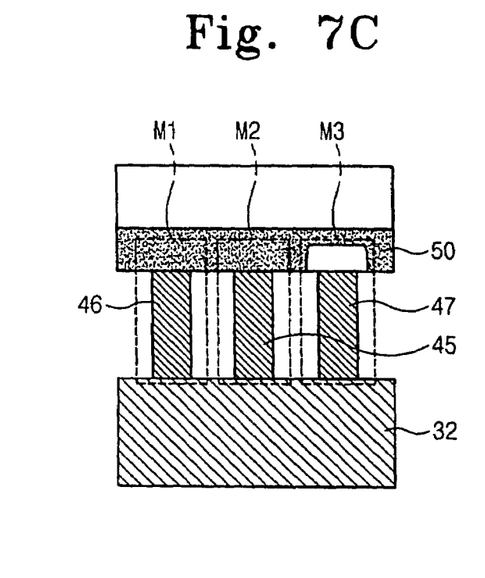
Figure 7D:
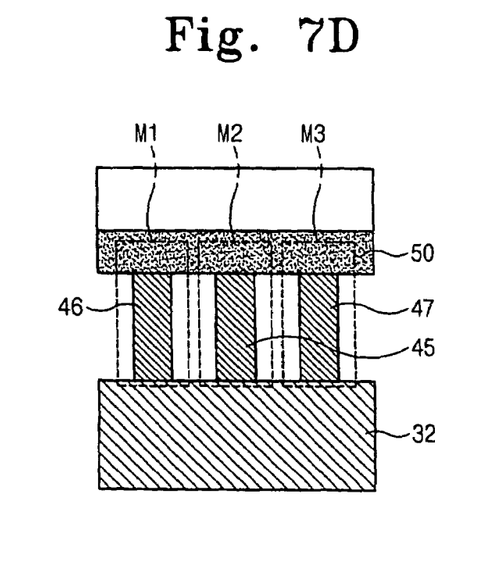

|  | A first memory element | A second memory element | A third memory element | Data state |
|---|---|---|---|---|
| FIG. 7A | OFF | OFF | OFF | A first state |
| FIG. 7B | ON | OFF | OFF | A second state |
| FIG. 7C | ON | ON | OFF | A third state |
| FIG. 7D | ON | ON | ON | A fourth state |

Referring to FIG. 7A and Table 2, when the phase-change patterns 50 of the memory elements M1, M2 and M3 are heated at a temperature higher than a melting temperature Tm for a first duration T1 and then cooled, the memory elements M1, M2 and M3 may transition to off-states. In embodiments of the invention, regions may be considered to be in an off-state when the region is in an amorphous state. For example, the memory elements M1, M2, M3 may be considered to be in an off-state when the respective phase-change pattern 50 is in an amorphous state. Heating of the phase-change pattern 50 at the melting temperature Tm or higher may be possible by adjusting an amount of an applied voltage and a current flowing through the bottom electrode 40.

Referring to FIG. 7B and Table 2, when a voltage higher than the first threshold voltage $V_{th}^1$ and lower than the second threshold voltage $V_{th}^2$ is applied to the memory elements M1, M2 and M3, the first memory element M1 may be changed from an amorphous state into a crystalline state. However, because these voltage conditions may be lower than threshold voltages $V_{th}^2$ and $V_{th}^3$ of the second and third memory elements M2 and M3, crystalline states of the second and third memory elements M2 and M3 may not change. Thus, stored data may correspond to a second state different from a first state in which all memory elements are in off-states.

Referring to FIG. 7C and Table 2, when a voltage higher than the second threshold voltage $V_{th}^2$ and lower than the third threshold voltage $V_{th}^3$ is applied to the memory elements M1, M2 and M3, the second memory element M2 may transition from an amorphous state to a crystalline state. With such a voltage being applied, a crystalline state of the third memory element M3 may not change, but a crystalline state of the first and second memory elements M1, M2 may change. Thus, a data state of the memory cell performing a writing operation under these conditions may correspond to a third state, which may be different from the first state and the second state described above.

In such cases, when the memory cell transitions from, e.g., the second state to the third state, one or more of the memory elements, e.g., M1, may be continue to be in an on-state. More particularly, e.g., when transitioning from the second state to third state, the first memory element M1 remains in an on-state, i.e., is in an on-state during both the second state and the third state. When a memory element, e.g., M1, is to be consecutively maintained in an on-state, an excessive current may flow through the first memory element M1, and power consumption may increase.

Accordingly, embodiments of the invention provide an alternative writing method for reducing power consumption of the memory device. The method may include resetting or restoring all the memory elements M1, M2 and M3 to an off-state, before changing the memory cell from a second state into a third state. For example, prior to applying voltages for writing data, respective regions of the phase-change pattern 50 corresponding to the memory elements M1, M2, M3 of the memory device may be restored to an off-state, e.g., an amorphous state. In some embodiments of the invention, the resetting or restoring step may only be performed, if, e.g., during a writing operation of a memory device including M memory elements, N memory elements are set to an "on-state" during a first step and then, during a second step, N+1 elements are set to an "on-state", where N is an integer where $1 \leq N < M$, and N+1 is less than or equal to M.

In embodiments of the invention, employing the resetting step, after resetting the memory elements M1, M2, M3, a voltage higher than the second threshold voltage $V_{th}^2$ and lower than the third threshold voltage $V_{th}^3$ may be applied to the memory elements M1, M2 and M3. As a result, because the memory elements M1, M2 and M3 may be restored to an off-state before a subsequent writing operation, a crystalline state of the first and second memory elements M1 and M2 may be selectively changed without excessive power consumption. In embodiments of the invention, such a resetting or restoring operation may be performed prior to a subsequent writing operation only if, during a previous operation, at least one of the memory elements was on.

As illustrated in FIG. 1, because the first duration T1 changing the phase-change pattern 50 into an amorphous state is shorter than the second duration T2 changing the amorphous state into a crystalline state, resetting the region (s), from the crystalline state, to the amorphous state may not significantly increase a writing operation time.

Referring to FIG. 7D and Table 2, when a voltage larger than the third threshold voltage $V_{th}^3$ is applied to the memory elements M1, M2 and M3, a crystalline state of the third memory element M3 may transition from an amorphous state to a crystalline state. In the exemplary embodiment, memory elements M1, M2 and M3 may transition to or maintain their on-states. Consequently, a data state of the memory cell performing a writing operation with this condition becomes a fourth state different from the first state, the second state and the third state set forth above. Similar to the exemplary scenario with regard to state 3 above, the writing operation described with regard to state 4 may cause excessive power consumption through the first and second memory elements M1 and M2, which may have been previously been in an on-state during the previous operation. Thus, in embodiments of the invention, the resetting or restoring process described above, for transitioning the memory elements M1, M2 and M3 to an amorphous state, may be performed before applying a voltage higher than the third threshold voltage $V_{th}^3$.

Referring to FIG. 6, a memory cell employing one or more aspects of the invention may have different I-V characteristics according to a data state of the memory cell. That is, an I-V curve may have different slopes, e.g., $\ominus_0$, $\ominus_1$ and $\ominus_2$, according to a data state of memory elements. The slope of each of the curves may correspond to a reciprocal of a resistance of the memory cell. Accordingly, a current measured at a predetermined read voltage may be different according to each data state. A reading operation of the invention may include determining a data state by sensing a change in current according to the data state.

In embodiments of the invention, a writing operation may be performed using a voltage forcing method in which a predetermined voltage may be applied on both ends of the memory elements or by a current forcing method in which a current of a predetermined magnitude may be applied on both ends of the memory elements. When a difference between these methods is related to a method of forming an external circuit connected to the bit line and source line, a writing operation of, e.g., the current forcing method may correspond to any known current-supplying methods that are compatible with aspects of the invention.

According to the second exemplary embodiment of the invention, the phase-change pattern 50 may be divided into a plurality of independent parts. In embodiments of the invention, the bottom resistor patterns 45, 46, 47 may be connected to corresponding parts of the phase-change pattern 50, and parts of the phase-change pattern 50 may be connected to the top electrode 60 in parallel.

Figure 8:
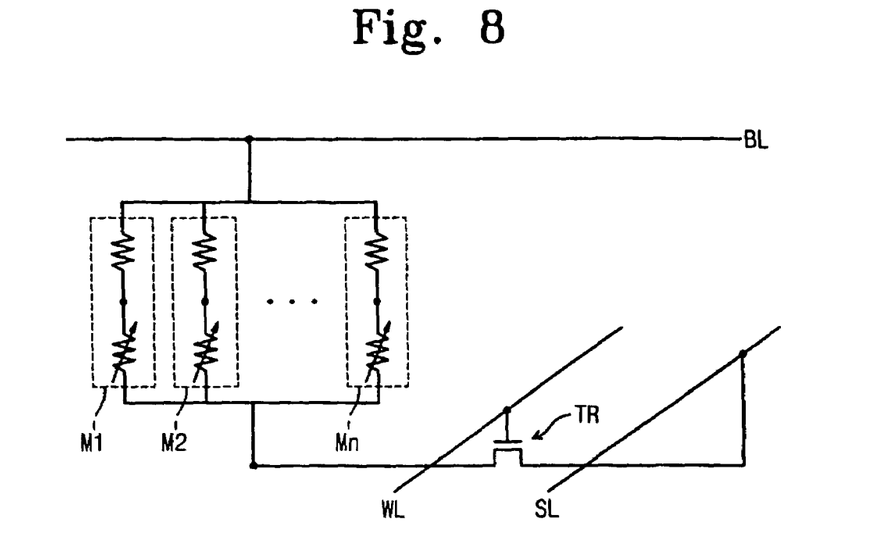
FIG. 8 illustrates a circuit diagram of a phase-change random access memory device according to a second exemplary embodiment of the invention.
Figure 9:
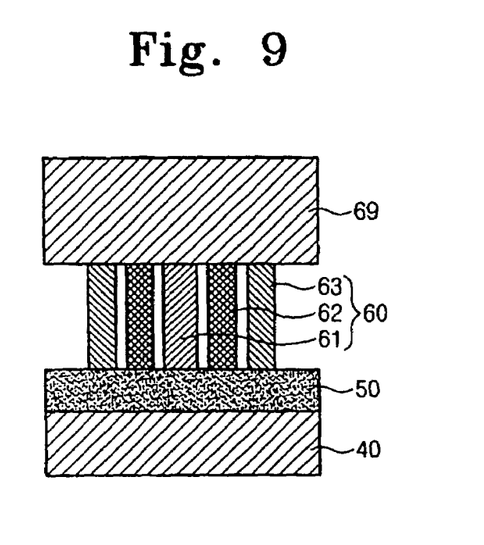
FIGS. 9 and 10 illustrate sectional views of a phase-change random access memory device according to the second exemplary embodiment of the invention.
Figure 10:
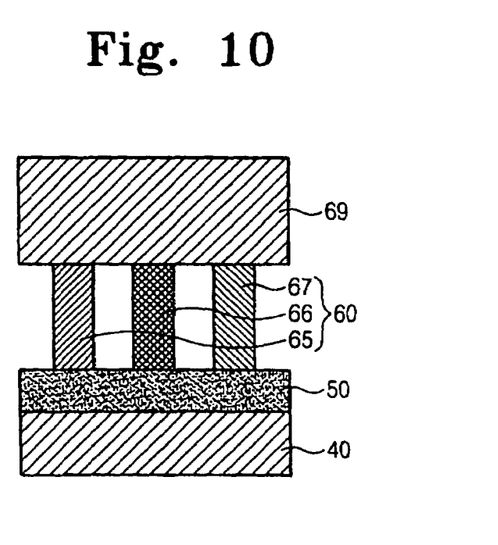

According to the exemplary embodiment of the invention illustrated in FIGS. 8 to 10, a bottom electrode 40 may be connected in series to a phase-change pattern 50, and a top electrode 60 may be connected to the phase-change pattern 50 in parallel.

Figure 12:
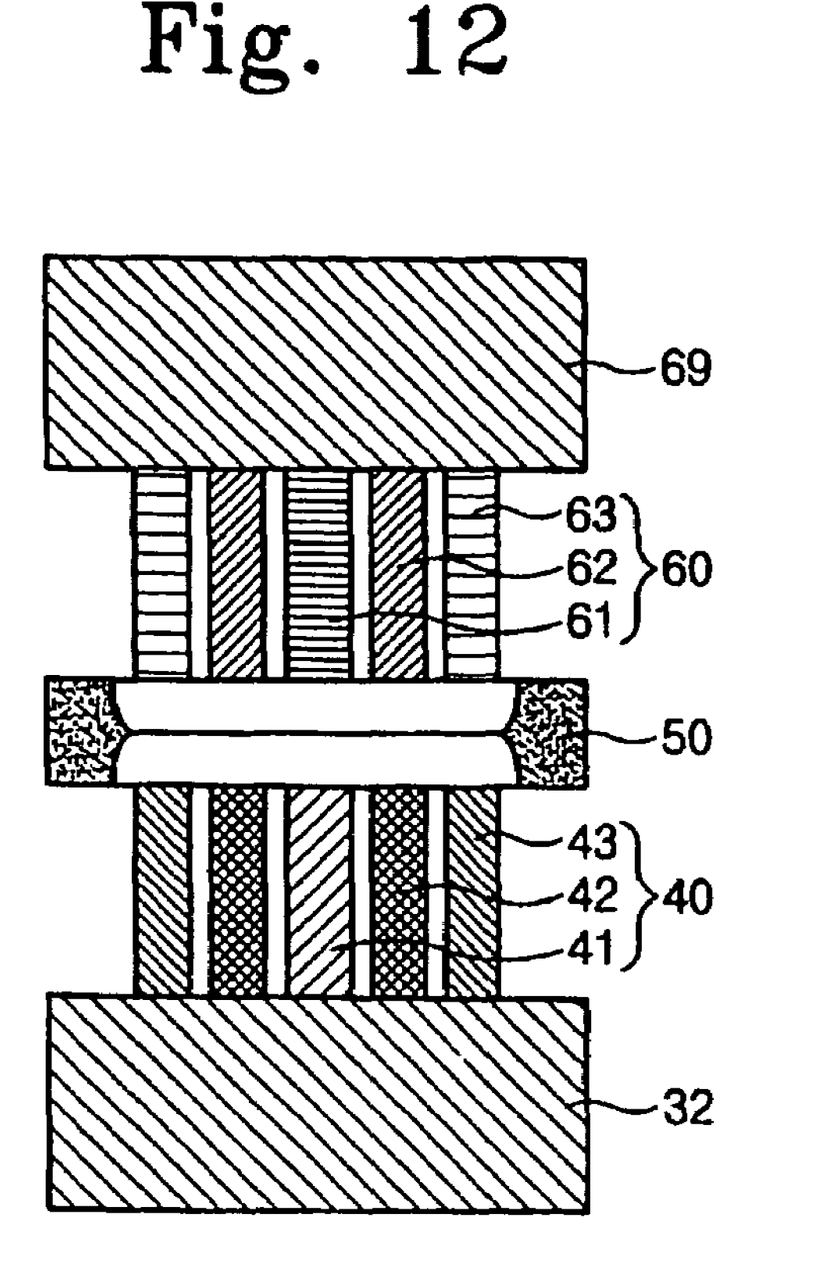
FIGS. 12 and 13 illustrate sectional views of a phase-change random access memory device according to the third exemplary embodiment of the invention.

According to these embodiments, the top electrode 60 may include a plurality of top resistor patterns, e.g., 61, 62, 63, 65, 66, 67. For example, as illustrated in FIGS. 9 and 12, the top electrode 60 may include a top axis electrode 61 and ring electrodes 62 and 63 surrounding the top axis electrode 61, and the top electrode 60 may be connected on side to the phase-change layer 50 and on an opposite side thereof to an upper pad 69. The features of the bottom resistor patterns 41, 42, 43 of the exemplary embodiments illustrated in FIGS. 5A and 5B may be applied to the exemplary embodiments of the top resistor patterns 61, 62, 63 of the exemplary embodiment of the invention illustrated in FIGS. 9 and 12.

Figure 13:
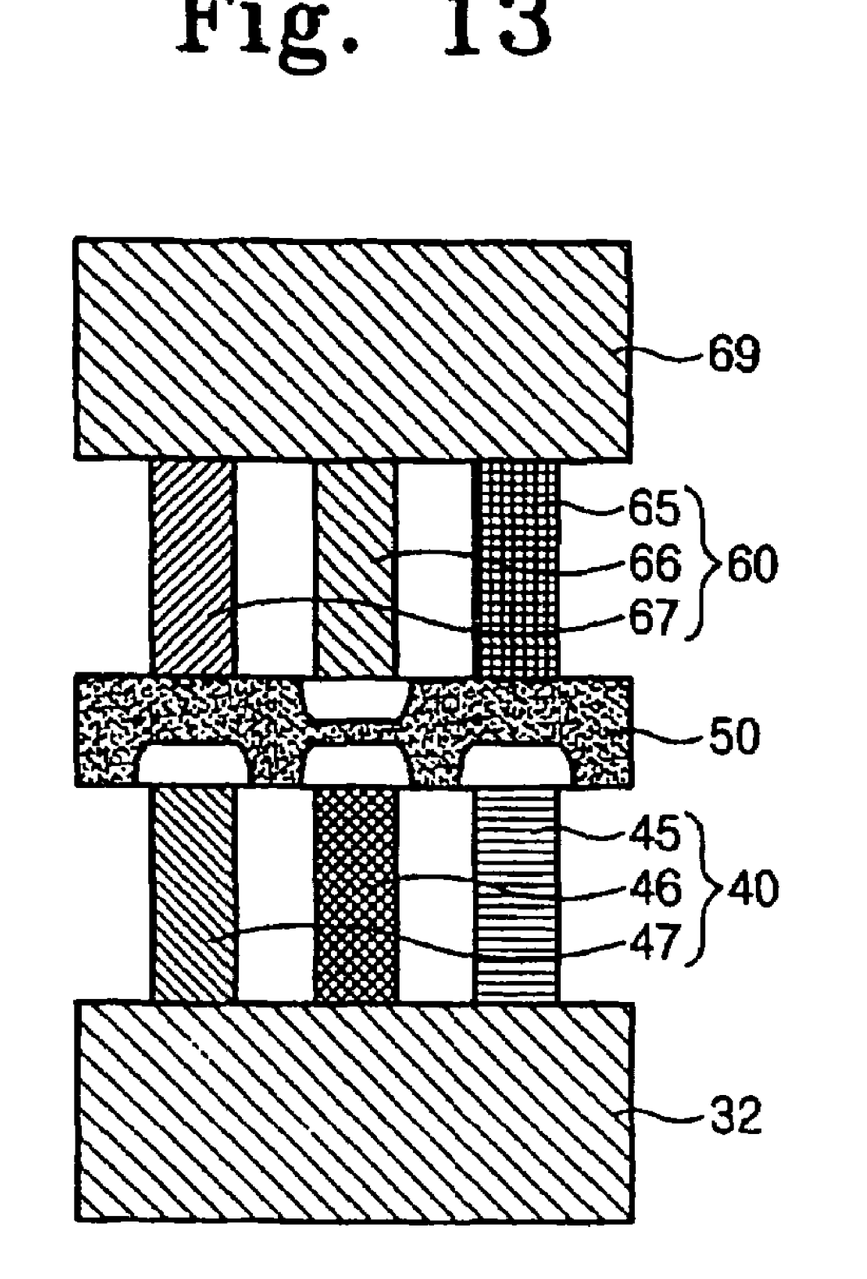

As illustrated in FIGS. 10 and 13, in embodiments of the invention, the top electrode 60 may include a plurality of independent top resistor patterns 65, 66 and 67. The features of the bottom resistor patterns 45, 46, 47 of the exemplary embodiment illustrated in FIG. 5C may be identically applied to the exemplary embodiments of the top resistor patterns 65, 66, 67 of the exemplary embodiment of the invention illustrated in FIGS. 10 and 13.

Figure 11:
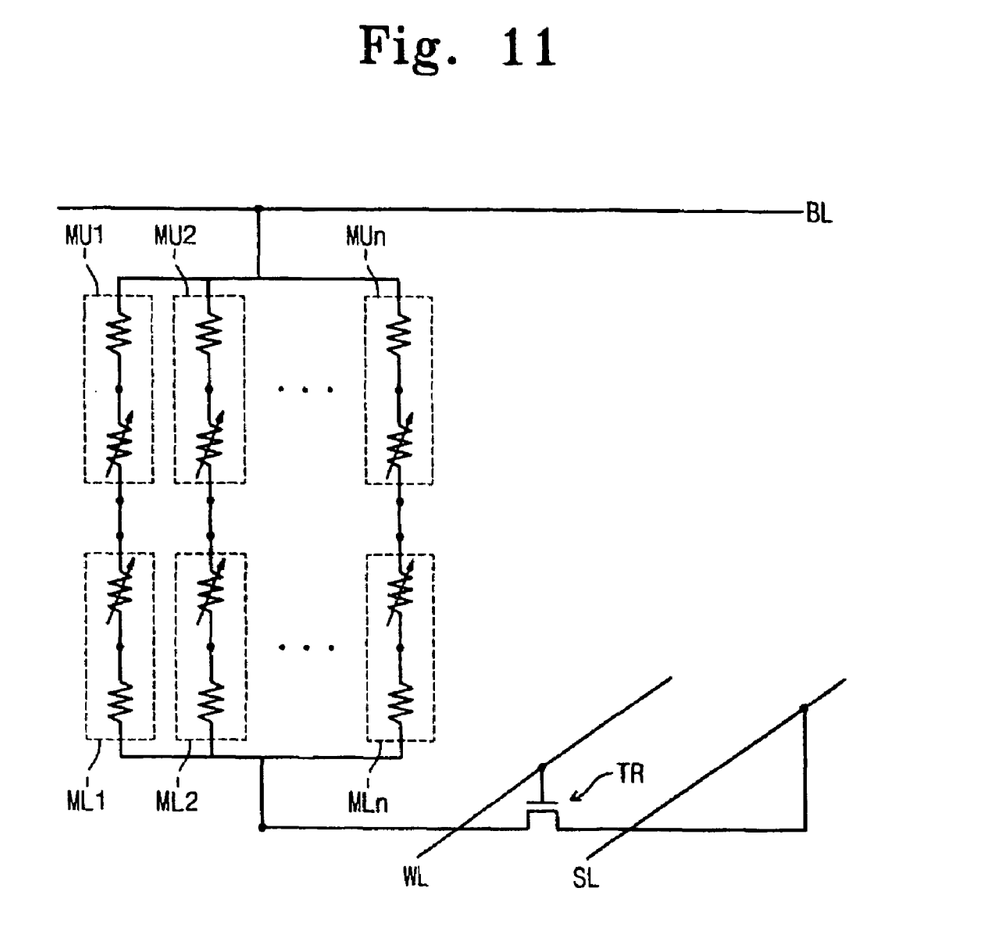
FIG. 11 illustrates a circuit diagram of a phase-change random access memory device according to a third exemplary embodiment of the invention.

As illustrated in FIGS. 11 to 13, in embodiments of the invention in which the bottom and top electrodes 40 and 60 are connected to the phase-change pattern 50 in parallel, one memory cell may include any number of bottom and/or top memory elements ML1 to MLn and MU1 to MUn. In embodiments of the invention, the top memory elements MU1 to MUn formed by the top resistor pattern may have respectively different threshold voltages, and the bottom memory elements ML1 to MLn formed by the bottom resistor pattern may have respectively different threshold voltages. Moreover, threshold voltages of the top memory elements MU1 to MUn and the bottom memory elements ML1 to MLn may be different. Because a number of memory elements constituting one memory cell may represent a number of data states that the memory cell may have, by increasing a number of memory elements, the phase-change random access memory device may store more data.

According to one or more aspects of the invention, bottom resistor patterns or top resistor patterns, which may constitute a bottom electrode or a top electrode, may be connected to a phase-change pattern in parallel. Because the bottom and top resistor patterns may be formed of respectively different materials and sizes, their electrical resistance may be different each from other. Accordingly, memory elements including the bottom and top resistor patterns and the phase-change pattern may have respectively distinguishable threshold voltages. Especially, when electrical resistances of bottom and top resistor patterns are process-dependent parameters determined in a manufacturing process, the memory elements of the invention may have excellent characteristics that distinguish threshold voltages when compared to a memory element that adjusts an applied voltage and current corresponding to external conditions to change a data state.

Exemplary embodiments of the invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A phase-change random access memory device, comprising:
   a phase-change pattern;
   a first electrode structure connected to the phase-change pattern; and
   a second electrode structure spaced apart from the first electrode structure and connected to the phase-change pattern,
   wherein at least one of the first electrode structure and the second electrode structure includes a plurality of resistor patterns connected to the phase-change pattern in parallel, and
   at least one of the resistor patterns has an electrical resistance different from another of the plurality of resistor patterns.

2. The phase-change random access memory device as claimed in claim 1, wherein at least one of the resistor patterns has a resistivity different from another of the plurality of resistor patterns.

3. The phase-change random access memory device as claimed in claim 1, wherein the resistor patterns include at least one of a titanium nitride, titanium aluminum nitride, polysilicon, a tantalum nitride, and tungsten.

4. The phase-change random access memory device as claimed in claim 1, further comprising:
   a transistor connected to the first electrode structure; and a bit line connected to the second electrode structure.

5. The phase-change random access memory device as claimed in claim 4, wherein:
   the first electrode structure includes a plurality of resistor patterns connecting the transistor with the phase-change pattern in parallel,
   the second electrode structure connects the bit line with the phase-change pattern in series, and
   memory elements including the resistor patterns and the phase-change pattern have respectively different threshold voltages.

6. The phase-change random access memory device as claimed in claim 4, wherein:
   the first electrode structure connects the transistor with the phase-change pattern in series;
   the second electrode structure includes the plurality of resistor patterns connecting the bit line with the phase-change pattern in parallel, and
   memory elements including the resistor patterns and the phase-change pattern have respectively different threshold voltages.

7. The phase-change random access memory device as claimed in claim 4, wherein:
   the first electrode structure includes a plurality of bottom resistor patterns connecting the transistor with the phase-change pattern in parallel,
   the second electrode structure includes a plurality of top resistor patterns connecting the bit line with the phase-change pattern in parallel,
   top memory elements including the top resistor patterns and the phase-change pattern have respectively different threshold voltages, and
   bottom memory elements including the bottom resistor patterns and the phase-change pattern have respectively different threshold voltages.

8. The phase-change random access memory device as claimed in claim 1, wherein each of the resistor patterns has a different size and/or is formed of a different material relative to the others of the plurality of resistor patterns.

9. The phase-change random access memory device as claimed in claim 1, wherein each of the plurality of resistor patterns is associated with a different portion of the phase change-pattern.

10. A phase-change random access memory device, comprising:
    a phase-change pattern;
    a first electrode structure connected to the phase-change pattern; and
    a second electrode structure spaced apart from the first electrode structure and connected to the phase-change pattern,
    wherein at least one of the first electrode structure and the second electrode structure includes a plurality of resistor patterns connected to the phase-change pattern in parallel,
    wherein each of the plurality of resistor patterns is associated with a different portion of the phase-change pattern and each resistor pattern-phase-change pattern portion corresponds to a memory element, threshold voltages of the memory elements being different from each other.

11. A phase-change random access memory device, comprising:

a phase-change pattern;

a first electrode structure connected to the phase-change pattern; and a second electrode structure spaced apart from the first electrode structure and connected to the phase-change pattern, wherein at least one of the first electrode structure and the second electrode structure includes a plurality of resistor patterns connected to the phase-change pattern in parallel, wherein the plurality of resistor patterns includes:

an axis electrode connected to one side of the phase-change pattern; and at least one ring electrode surrounding the axis electrode and connected to one side of the phase-change pattern.

12. The phase-change random access memory device as claimed in claim 11, further comprising insulation patterns interposed between the axis electrode and the ring electrons to electrically insulate them.

13. A method of operating a phase-change memory cell including a plurality of memory elements having respectively different threshold voltages and connected in parallel, the method comprising:

a write operation including selectively changing resistances of the memory elements by using a difference between the threshold voltages of the memory elements to allow the phase-change memory cell to have several data states; and a read operation including determining the data state of the phase-change memory cell by sensing a difference in current relative to a difference in resistance between the memory elements.

14. The method as claimed in claim 13, wherein the writing operation comprises:

resetting all the memory elements into off-states; and selectively setting at least one of the memory elements into an on-state, wherein the setting of the memory elements includes selectively heating a part of the memory elements by using the difference between the threshold voltages.

15. The method as claimed in claim 14, wherein the resetting of the memory elements comprises applying a voltage higher than the highest voltage among the threshold voltages, and wherein the setting of the memory elements includes applying a voltage between the threshold voltages to selectively set the memory elements having a threshold voltage lower than the applied voltage into on-states.

16. The method as claimed in claim 14, wherein the setting of the memory elements comprises:

a first step of setting selectively an N number of the memory elements into an on-state, N being less than M; and a second step of setting selectively an N+1 number of the memory elements into an on-state, N+1 being less than or equal to M, wherein M denotes a total number of the memory elements, and N is an integer where $1 \leq N < M$, and wherein the resetting of the memory elements is performed between the first step of setting and the second step of setting.

17. The method as claimed in claim 14, wherein each of the memory elements comprises a phase-change material and conductive heating units connected to one side of the phase-change material, the phase-change material of the memory elements corresponding to a phase-change pattern for the phase-change memory cell, the conductive heating units of the memory elements having respectively different resistances, wherein the resetting of the memory elements includes changing a phase-change material of all the memory elements into an amorphous state, and the setting of the memory elements includes selectively changing a phase-change material of a predetermined memory element into a crystalline state using a difference of resistances of the conductive heating units.

18. The method as claimed in claim 13, wherein the write operation is performed by using one of a voltage forcing method and a current forcing method, the voltage forcing method including applying a voltage of a predetermined magnitude to both ends of the memory elements, the current forcing method including applying a current of a predetermined magnitude to both ends of the memory elements.

19. The method as claimed in claim 13, wherein each of the memory elements corresponds to a portion of a phase-change pattern, and the write operation includes selectively changing resistances of the memory elements by changing a state of the corresponding portion of the phase-change pattern to one of an amorphous state and a crystalline state.

* * * * *